US006763294B2

United States Patent
Mason et al.

(10) Patent No.: US 6,763,294 B2
(45) Date of Patent: Jul. 13, 2004

(54) SYSTEM AND METHOD FOR VALIDATING QUADRATURE SIGNALS

(75) Inventors: Dawn M. Mason, Cedar Falls, IA (US); David J. Easton, Cedar Falls, IA (US)

(73) Assignee: Deere & Company, Moline, IL (US)

( * ) Notice: Subject to any disclaimer, the term of this patent is extended or adjusted under 35 U.S.C. 154(b) by 0 days.

(21) Appl. No.: 10/139,416

(22) Filed: May 6, 2002

(65) Prior Publication Data

US 2003/0208310 A1 Nov. 6, 2003

(51) Int. Cl.[7] ................................................. B62D 5/00

(52) U.S. Cl. ............................ 701/43; 701/41; 180/443

(58) Field of Search .................... 701/43, 41; 341/11, 341/15; 356/619; 250/231.14, 237 G; 702/150, 106; 180/6.44, 402, 443

(56) References Cited

U.S. PATENT DOCUMENTS

| | | | |
|---|---|---|---|
| 6,000,490 A | 12/1999 | Easton | 180/402 |
| 6,039,132 A | 3/2000 | Easton | 180/6.44 |
| 6,208,922 B1 | 3/2001 | Easton | 701/41 |
| 6,215,119 B1 * | 4/2001 | Markham et al. | 250/231.14 |
| 6,298,931 B1 | 10/2001 | Easton | 180/6.44 |
| 6,345,674 B1 | 2/2002 | Easton | 180/6.44 |
| 2002/0105319 A1 * | 8/2002 | Delaporte | 324/207.13 |
| 2003/0110003 A1 * | 6/2003 | Topmiller | 702/150 |

* cited by examiner

Primary Examiner—Marthe Y. Marc-Coleman

(57) ABSTRACT

A system and method is provided for use in a control system, such as a steering control system, for validating quadrature signals. A system makes a determination of validity based on the timing of detected state changes in the quadrature signals. To accomplish this, the amount of time that elapses between successive transitions is compared to the amount of time that elapses in an adjacent time period. If the two time periods are close enough, the signals are considered valid.

16 Claims, 7 Drawing Sheets

SYSTEM AND METHOD FOR VALIDATING QUADRATURE SIGNALS

FIELD OF THE INVENTION

This invention relates to the field of signal validation. In particular, this invention is drawn to a system for validating quadrature signals generated by sensors in a steering control system.

BACKGROUND OF THE INVENTION

In control systems, it is common to use sensors to generate signals relating to various conditions in the system. The sensor signals can then used by the control system in any desired way. For example, in a steering control system, various conditions are sensed (e.g., wheel speed, motor speed, steering wheel speed and position, etc.) and used by the steering control system. It is therefore important that signals generated by sensors are accurate in order to describe what is occurring in the system.

It is also common to use sensors that generate quadrature signal pairs. For a valid quadrature pair, both signals should have nearly a 50% duty cycle and be nearly 90 degrees out of phase. These characteristics ensure that a microprocessor in a control system will have enough time to decode the signals, and to provide correct measurement of speed and direction of a sensed object.

One problem with sensors that generate quadrature signals is that the quadrature signals may not meet the desired duty cycle and phase requirements. This may be due to several factors. For example, the sensor may be misaligned, causing the duty cycle of the signals to be much greater or much less than 50%. Misalignment may also cause the signals to be more or less than 90 degrees out of phase. Also, the sensor itself may fail, or may not be capable of producing quadrature under all conditions. For example, some sensors produce correct quadrature only when the object they are sensing is rotating at a particular speed. Also, propagation delays from electronic circuitry may alter the phase relationship of the signals.

It can therefore be seen that in order to have confidence that a control system is functioning properly, quadrature signals should be evaluated for accuracy and validity.

SUMMARY OF THE INVENTION

A method of validating a quadrature signal pair from a sensor in a steering control system is provided, including the steps of: detecting consecutive voltage transitions in first and second signals of the quadrature pair; for three consecutive detected voltage transitions, calculating the elapsed time between the first and second voltage transitions and the elapsed time between the second and third voltage transitions; and determining the validity of the quadrature signal pair by comparing the calculated elapsed times.

Another embodiment of the invention provides a method of validating a quadrature signal pair in a steering control system comprising the steps of: detecting when a first signal of the quadrature pair changes states; detecting when a second signal of the quadrature pair changes states; and evaluating the validity of the quadrature signal pair based on when the first and second signals change states.

Another embodiment of the invention provides a steering control system comprising: a quadrature sensor for sensing conditions in the system and generating a quadrature signal pair; a processor coupled to the quadrature sensor, wherein the processor performs the following functions: detecting edges in first and second signals of the quadrature pair, after detecting a plurality of consecutive edges, calculating elapsed time periods between consecutive edges, and determining the validity of the quadrature pair by comparing two adjacent elapsed time periods.

Another embodiment of the invention provides a method of validating a quadrature signal pair generated by a quadrature sensor in a control system comprising the steps of: detecting state changes in first and second quadrature signals; calculating the time periods between consecutive detected state changes; and making a determination of the validity of the quadrature signal pair based upon the calculated time periods.

BRIEF DESCRIPTION OF THE DRAWINGS

The present invention is illustrated by way of example and is not limited to the figures of the accompanying drawings, in which like references indicate similar elements and in which.

FIGS. to 9–11 are flow charts illustrating one example of how the present invention may be implemented in software.

DESCRIPTION OF THE INVENTION

Figure 1:
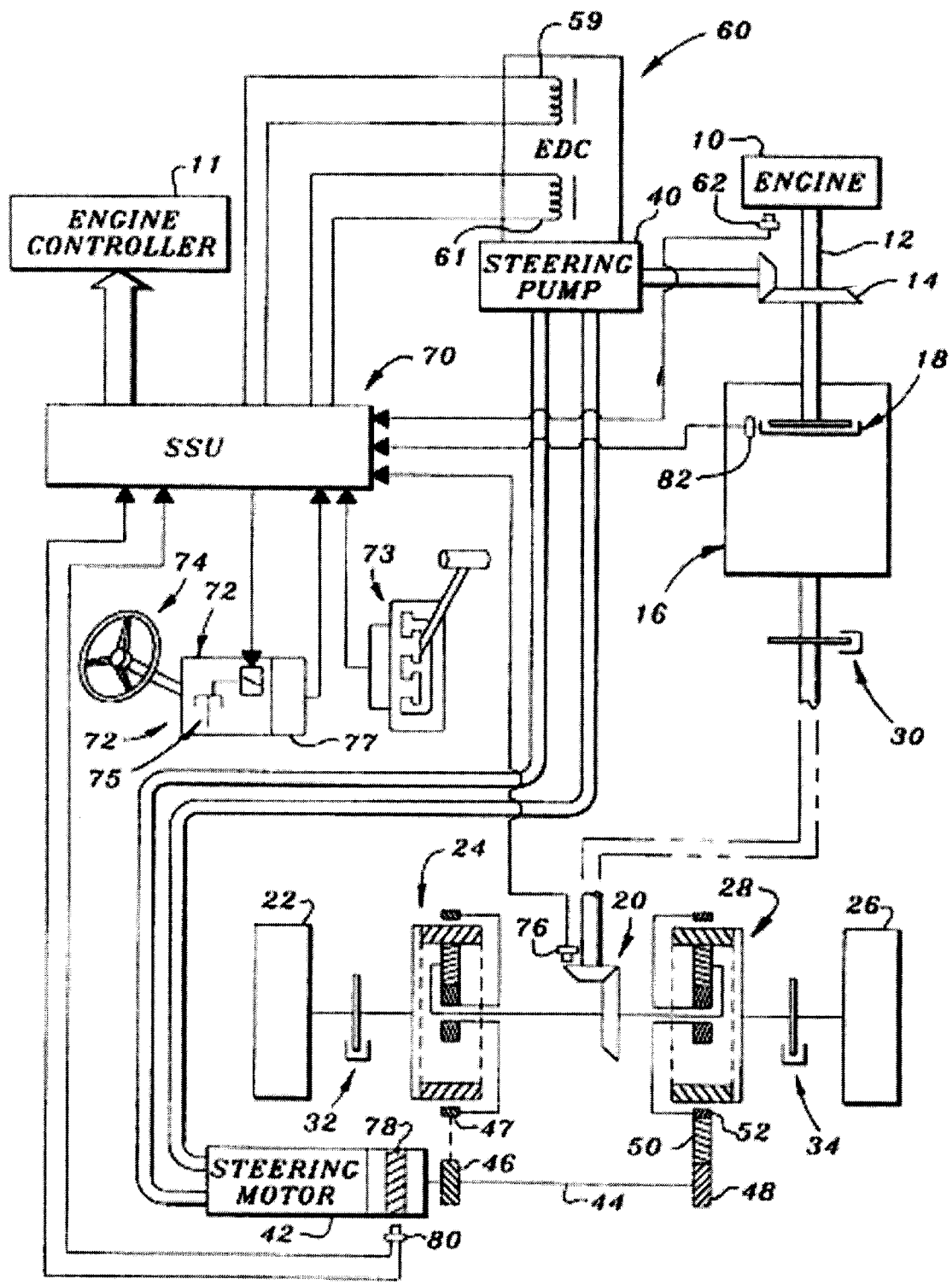
FIG. 1 is a simplified schematic diagram of a steering control system to illustrate one example of an environment in which the invention may be used.

In general, the present invention provides a system and method for validating quadrature signals. FIG. 1 illustrates one example of an environment in which the present invention may be used. As described in more detail below, the present invention may also be used in other applications and environments that utilize quadrature signals.

FIG. 1 shows a simplified schematic diagram of a tracked vehicle drive and steering system. Referring to FIG. 1, an engine 10 of a tracked vehicle has an output shaft 12 which drives a right angle gear 14 and a transmission 16, such as a 16-speed powershift transmission which is available on production John Deere 8000T tractors. The transmission 16 includes hydraulically operated clutches and brakes (not shown), various ones of which will operate as a main clutch 18 in response to a conventional clutch pedal and linkage (not shown). The engine 10 is controlled by an electronic engine control unit 11. The transmission 16 drives a final or right angle drive 20, which drives a left track drive wheel 22 via left steering planetary drive 24, and a right track drive wheel 26 via right steering planetary drive 28. The steering planetary drives 24 and 28 are preferably such as described in U.S. Pat. No. 5,390,751, issued Feb. 21, 1995 to Puetz et al., and assigned to the assignee of this application. Additional outboard planetaries (not shown), as provided on John Deere 8000T tractors, are mounted between the steering planetaries and the respective drive wheels, but are not further described because they are not directly involved in the subject matter of this application. A parking brake 30 is coupled to the output shaft of transmission 16, and left and right service brakes 32, 34 are coupled to the left and right drive wheels 22, 26, respectively.

The right angle gear 14 drives a variable displacement steering pump 40, such as a 75 cc, 90 series pump made by Sauer-Danfoss. The pump 40, in turn, powers a hydraulic fixed displacement steering motor 42, such as a 75 cc, 90 series motor, also made by Sauer-Danfoss Inc. The steering motor 42 drives, via a cross shaft 44 and gear 46, a ring gear 47 of left planetary drive 24, and via cross shaft 44, gear 48 and reverser gear 50, a ring gear 52 of right planetary drive 28.

The steering pump 40 has a swashplate (not shown), the position of which is controlled by a swashplate control valve or electronic displacement control (EDC) 60. The EDC is preferably a two stage device with first stage including a flapper type valve operated by a pair of solenoids 59, 61, and a second stage including a boost stage to the pump, such as is used on the production John Deere 8000T Series tracked tractor.

An engine speed sensor 62, such as a commercially available variable reluctance sensor, provides an engine speed signal to a steering system unit (SSU) 70. The solenoids 59, 61 of valve 60 are controlled by pulse-width-modulated (PWM) pump control signals generated by SSU 70. The SSU 70 is communicated with the engine control unit 11.

An operator controlled steering wheel 74 is preferably connected to a non-spring centered input mechanism 72, such as described in U.S. Pat. No. 6,000,490, issued Dec. 14, 1999 to Easton, and assigned to the assignee of the present application. The input mechanism 72 includes an electromagnetically controlled friction device or brake 75 and a rotary position transducer or incremental encoder 77, such as a commercially available Grayhill Series 63R encoder or an OakGrigsby 900 Optical Encoder. The encoder 77 provides to SSU 70 a steering wheel position signal representing the position of operator controlled steering wheel 74. The encoder 77 generates a plurality, preferably 128, of pulses per each revolution of the steering wheel 74. The SSU 70 then repeatedly generates and updates a COUNT value representing the number of optical encoder pulses corresponding to the actual position of the steering wheel 74 relative to the position of the steering wheel 74 at start-up. This description relates to a steering input device with a non-spring centered neutral position, but the present invention could also be applied to a system with a spring-centered steering input device. The SSU 70 also receives signals from gear shift lever transducer 73, such as described in U.S. Pat. No. 5,406,860, issued Apr. 18, 1995 to Easton et al.

A drive line rotation speed sensor 76, preferably a differential Hall-effect speed sensor such as used on production John Deere 8000T tractors, is mounted in proximity to the final drive 20, and provides to the SSU 70 a variable frequency final drive speed or wheel speed signal. A magnetic ring 78 is mounted for rotation with the motor 42, and a Hall-effect transducer 80 mounted near the magnetic ring 78 provides to the SSU 70 a quadature signal pair. A pair of clutch status switches 82 are located within the transmission 16 and are operatively associated with the linkage (not shown) between the clutch pedal (not shown) and the main clutch 18, and provide a clutch status signal to the SSU 70. The SSU 70 includes one or more commercially available microprocessors (not shown in FIG. 1) which perform various functions, such as steering control.

Figure 2:
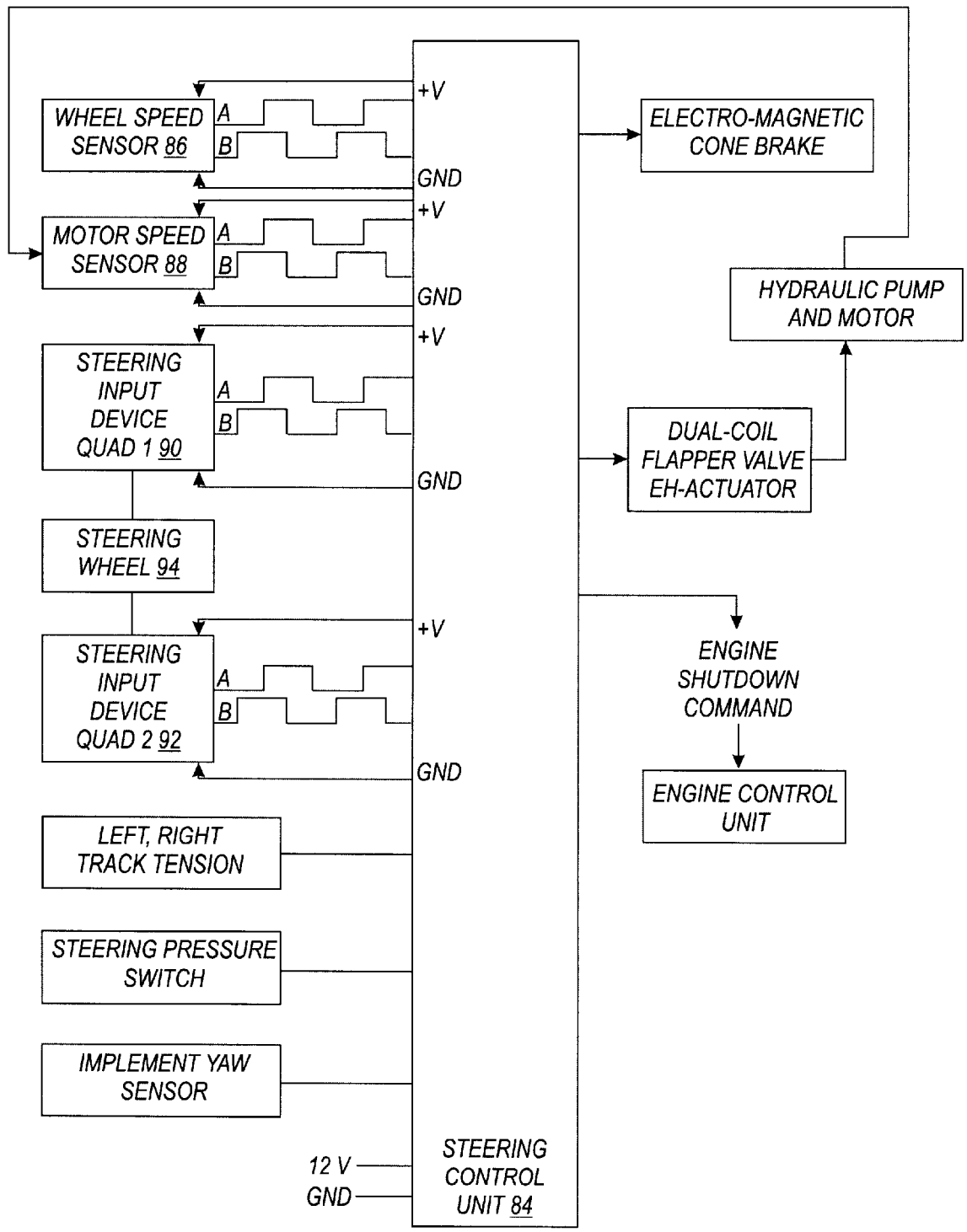
FIG. 2 is a block diagram showing an example of the use of sensors that generate quadrature signals in a steering control environment.

FIG. 2 is a block diagram showing an example of the use of sensors that generate quadrature signals in a steering control environment, similar to the environment shown in FIG. 1. FIG. 2 shows a steering control unit (SCU) 84, which is provided by a microprocessor that may be a part of a steering system unit, such as SSU 70 described above. A wheel speed sensor 86 is provided by a quadrature encoder that generates two data signals (A and B), which are provided to the SCU 84. Similarly, a motor speed sensor 88 also provides quadrature signals to the SCU 84. FIG. 2 also shows first and second quadrature steering input devices 90 and 92 operatively coupled to a steering wheel 94. The devices 90 and 92 each provide a pair of quadrature signals to the SCU 84. Various other components of a steering control system are also shown in FIG. 2, although none are essential to the operation of the present invention.

One or more of the sensors in a control system (such as the steering control system described above) may be provided by an incremental optical encoder (or any other type of sensor that generates quadrature signals) that generates two data signals that are 90 degrees out of phase with each other, and have a 50% duty cycle. Each data signal contains two voltage transitions, or edges, per cycle. Therefore, an encoder that generates 128 cycles per revolution provides 512 transitions per revolution.

The quadrature signals can provide a control system information relating to speed and displacement (e.g., the rate and number of transitions). In addition, the phase difference between the quadrature signals can provide information relating to direction. For example, forward travel can be detected if the first signal lags the second signal by 90 degrees (or vise versa). Similarly, reverse travel can be detected if the second signal lags the first signal by 90 degrees (or vise versa). Rather than looking only at the phase difference to determine a direction, a system can look at changes of state (i.e., the point where a signal transitions from one voltage to another). A system can sample the states of the first and second quadrature signals and make a determination of the direction of travel based state transitions. Table I provides one example of how a system can make a determination of direction based on state transitions, where the states of the two signals are identified as either high (1) or low (0).

TABLE I

| Reverse Direction | | Forward Direction | |
|---|---|---|---|
| Previous State | Present State | Previous State | Present State |
| 0, 1 | 0, 0 | 0, 1 | 1, 1 |
| 1, 1 | 0, 1 | 1, 1 | 1, 0 |
| 1, 0 | 1, 1 | 1, 0 | 0, 0 |
| 0, 0 | 1, 0 | 0, 0 | 0, 1 |

For example, in the example shown in Table I, if the quadrature state transitions from 0,1 to 0,0 (i.e., the first signal does not change and the second signal goes from high to low), then the sensor has detected the reverse direction. Similarly, if the quadature transitions from 0,1 to 1,1 (i.e., the second signal does not change states and the first goes from low to high), then the sensor has detected the reverse direction. There are also four possible state changes that are not possible, if the sensor is functioning properly (i.e., 0,0 to 1,1; 0,1 to 1,0; 1,0 to 0,1; and 1,1, to 0,0). There are commercially available quadrature decoding devices that can decode quadrature signals in the manner described above.

Figure 3:
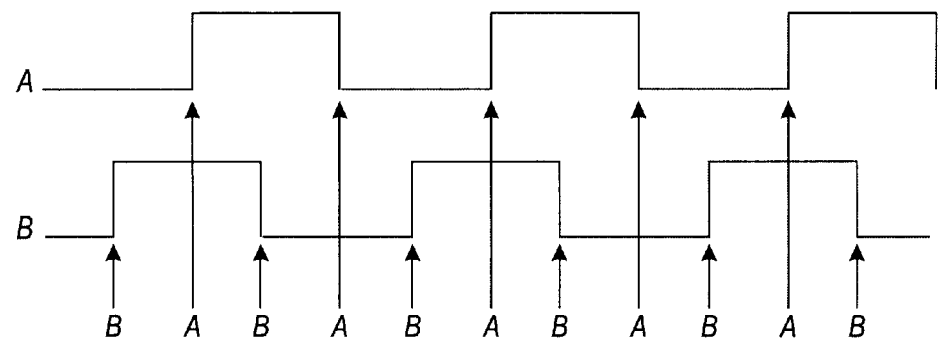
FIGS. 3–6 are diagrams of quadrature signal pairs.
Figure 4:
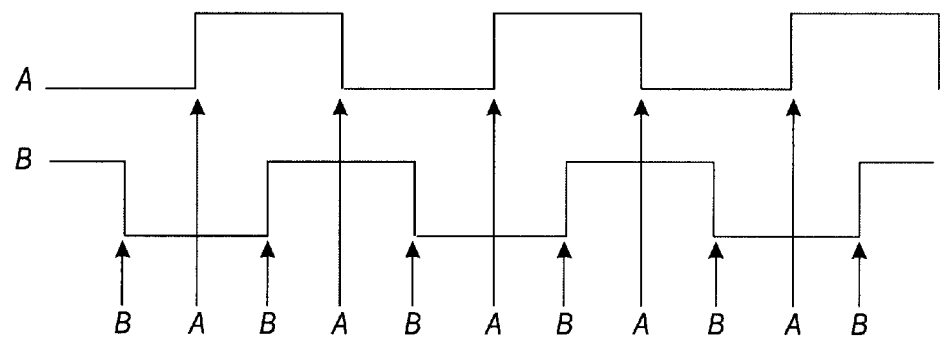

FIGS. 3–6 show examples of quadrature signal pairs. FIG. 3 shows a pair of quadrature signals having a desired duty cycle of 50% and a phase difference of 90 degrees. Similarly, FIG. 4 also shows a pair of quadrature signals having a desired duty cycle of 50% and a phase difference of 90 degrees. In FIG. 3, the second signal (B) lags the first signal (A) by 90 degrees. In contrast, in FIG. 4, the second signal (B) leads the first signal (A) by 90 degrees. Using the convention illustrated in Table I, the signals in FIG. 3 show forward travel and the signals in FIG. 4 show reverse travel.

Figure 5:
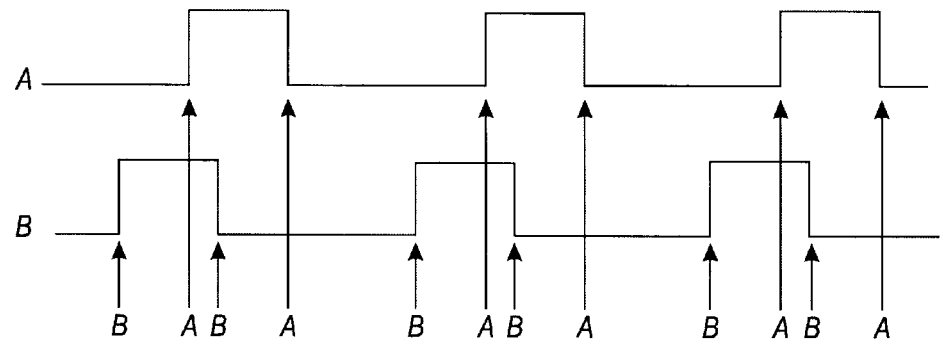
Figure 6:
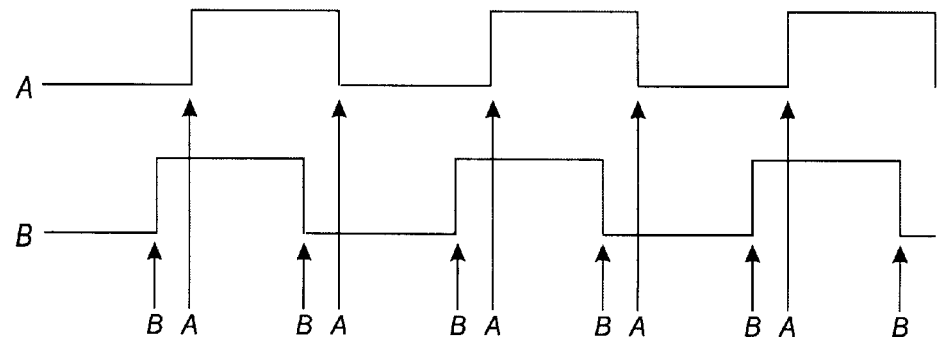

As mentioned above, it is possible for sensors to generate quadrature signals that do not meet desired duty cycle or phase requirements. FIG. 5 shows signals A and B that do not have a 50% duty cycle. FIG. 6 shows signals A and B that are not 90 degrees out of phase. FIGS. 5 and 6 are examples of signals that correctly indicate speed and direction but do not meet requirements for complete confidence. Thus, the microprocessor considers them not to be valid. Should the phase relationship or duty cycle become even worse, for example, if the signal sequence becomes BB, AA, BB, AA, etc., such signals convey the speed of the sensed device but do not convey the direction, and are unusable for a control system.

The present invention provides a way of determining whether the quadrature signals generated by a sensor are valid. In general, a system makes a determination of validity by looking at when the signals change states, or transition from one voltage level to another. To accomplish this, the amount of time that elapses between successive transitions is compared to the amount of time that elapses in an adjacent time period. If the two time periods are close enough, the signals are considered reliable and therefore valid. With this information, the system can then be confident it is responding only to valid sensor information. When the quadrature information is not reliable, the system can provide diagnostic information to the user, so that sensors can be adjusted or replaced.

In FIGS. 3–6, each edge, or transition point, is shown by arrows and labeled "A" or "B". As shown in FIGS. 3–4, if the duty cycle is 50% and the phase difference is 90 degrees, the times between successive edges are approximately equal. In contrast, if the duty cycle is not 50%, the times between successive edges are not equal (FIG. 5). Similarly, if the phase difference is not 90 degrees, the times between successive edges are also not equal (FIG. 6). The present invention takes advantage of this fact to validate quadrature signals. The invention looks at three successive edges (e.g., A, B, A or B, A, B) of the quadrature pair to determine two adjacent elapsed time values (e.g., A–B, B–A or B–A, A–B). The two elapsed time values are compared, and if sufficiently different, the quadrature signals are considered invalid. The standards used to make determinations of validity depend on many factors, including desired levels of accuracy and the accuracy of sensors used. In one example, if the difference between two successive elapsed time values is greater than 50% of the lower elapsed time value, the quadrature lines are considered invalid. In another example, the quadrature pair can be provided a confidence factor, depending on the comparison, rather than simply being labeled "valid" or "invalid".

Figure 7:
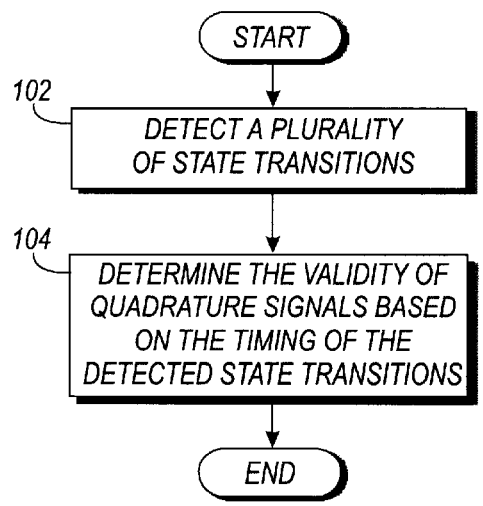
FIGS. 7 and 8 are flow charts illustrating examples of the operation of the present invention.
Figure 8:
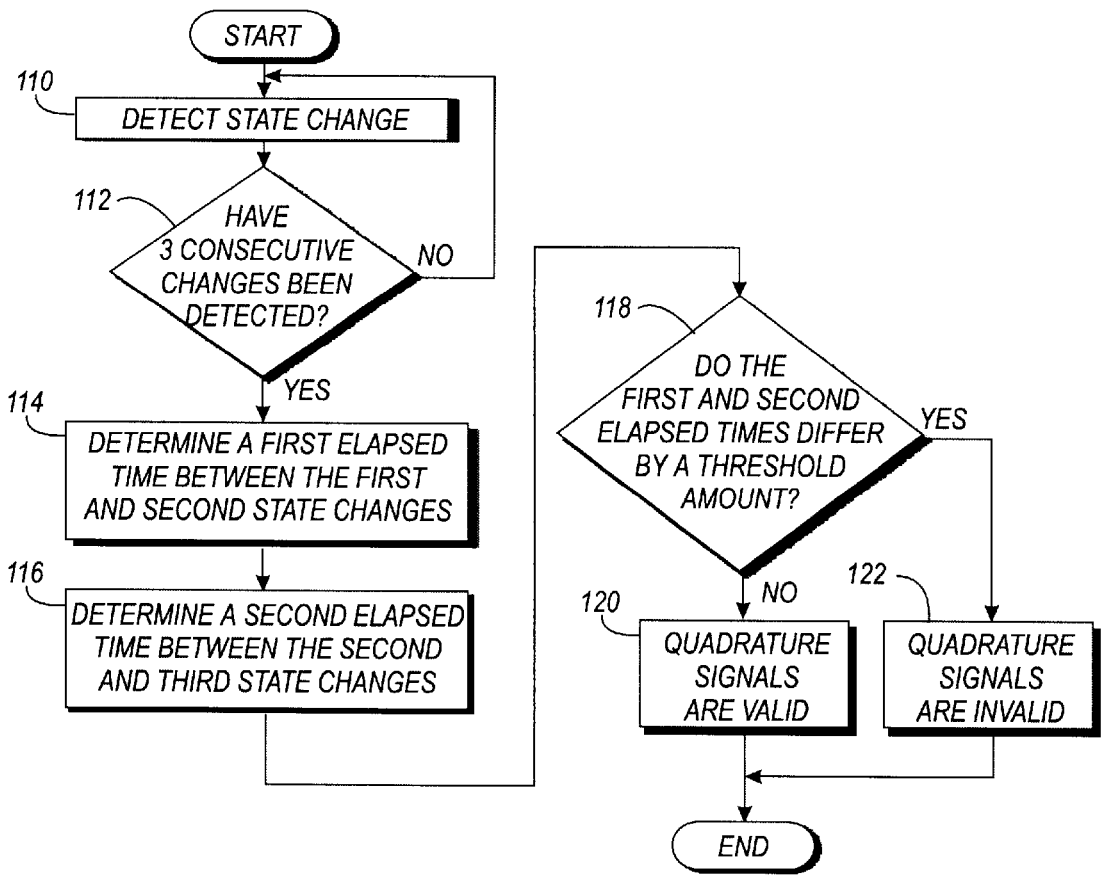

FIGS. 7 and 8 are flow charts illustrating examples of the operation of the present invention. FIG. 7 shows a process starting with step 102, where a plurality of state transitions is detected in a quadrature signal pair. The process ends at step 104, where the validity of the quadrature signal pair is determined based on the timing of the detected state transitions. FIG. 8 shows a more detailed process. At step 110, a state change (or voltage transition, etc.) is detected. At step 112, the process asks whether three consecutive states changes have been detected (e.g., A, B, A or B, A, B). If not, the process goes back to step 110 where another state change is detected. If three consecutive state changes are detected, the process proceeds to step 114, where a first elapsed time between the first and second state changes is determined. Referring back to FIGS. 3–6, this step refers to the measurement of elapsed time from a first edge to a second edge (A–B or B–A). Next, at step 116, a second elapsed time between the second and third state changes is determined. Referring back to FIGS. 3–6, this step refers to the measurement of elapsed time from the second edge to a third edge (B–A or A–B). Next, at step 118, the process asks whether the first and second elapsed times differ by a threshold amount. Like in the example mentioned above, the threshold can be defined as a percentage of one of the elapsed time values. In other examples, the threshold can be defined in other ways, such as a minimum elapsed time between transition. If the first and second elapsed times do not differ by more than the threshold amount, the process proceeds to step 120 where the quadrature signals are declared valid. If the first and second elapsed times do differ by at least the threshold amount, the process proceeds to step 122 where the quadrature signals are declared invalid. The processes illustrated in FIGS. 7 and 8 may repeat continuously, or may be repeated as desired.

Figure 9:
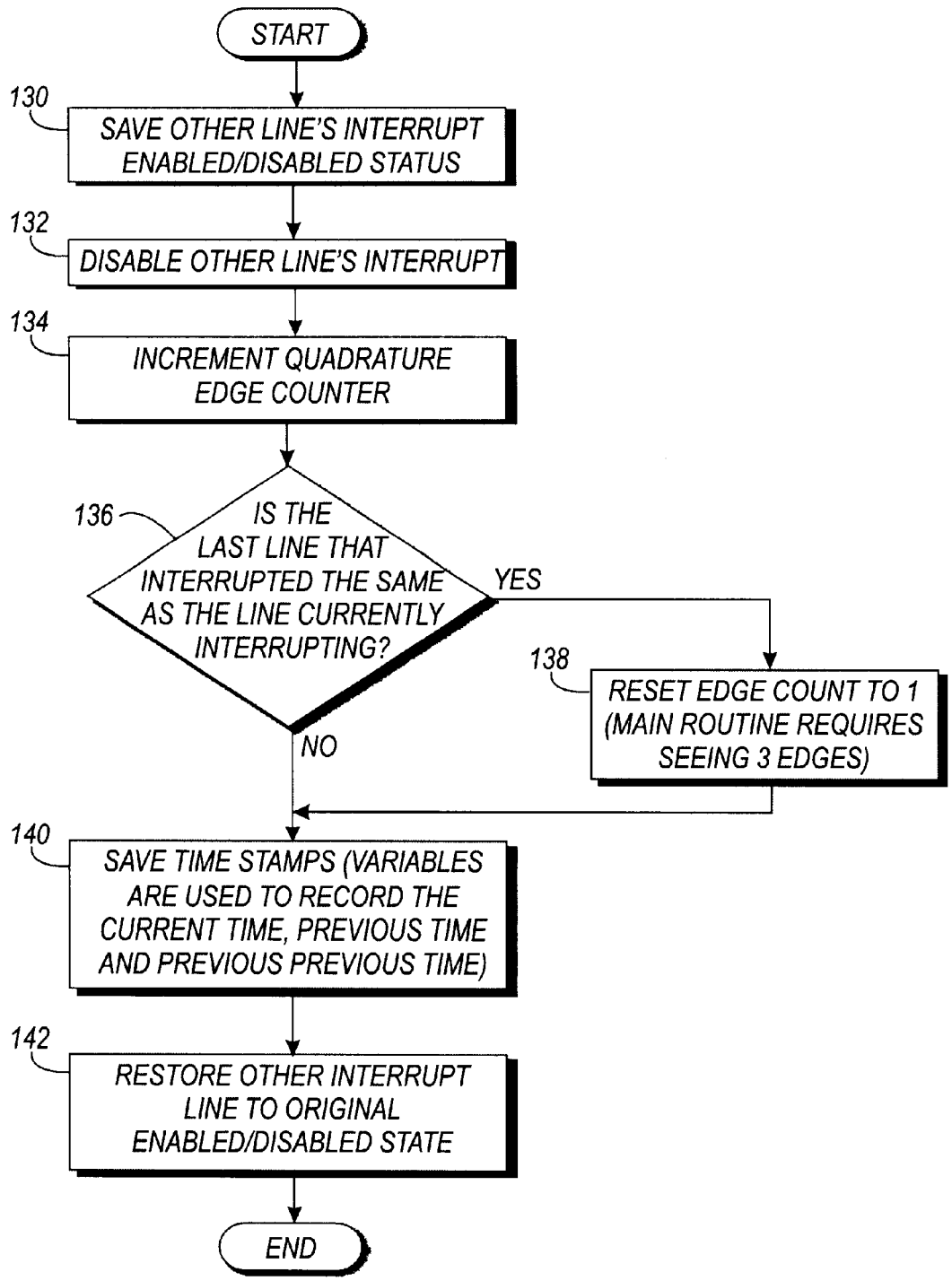
Figure 10:
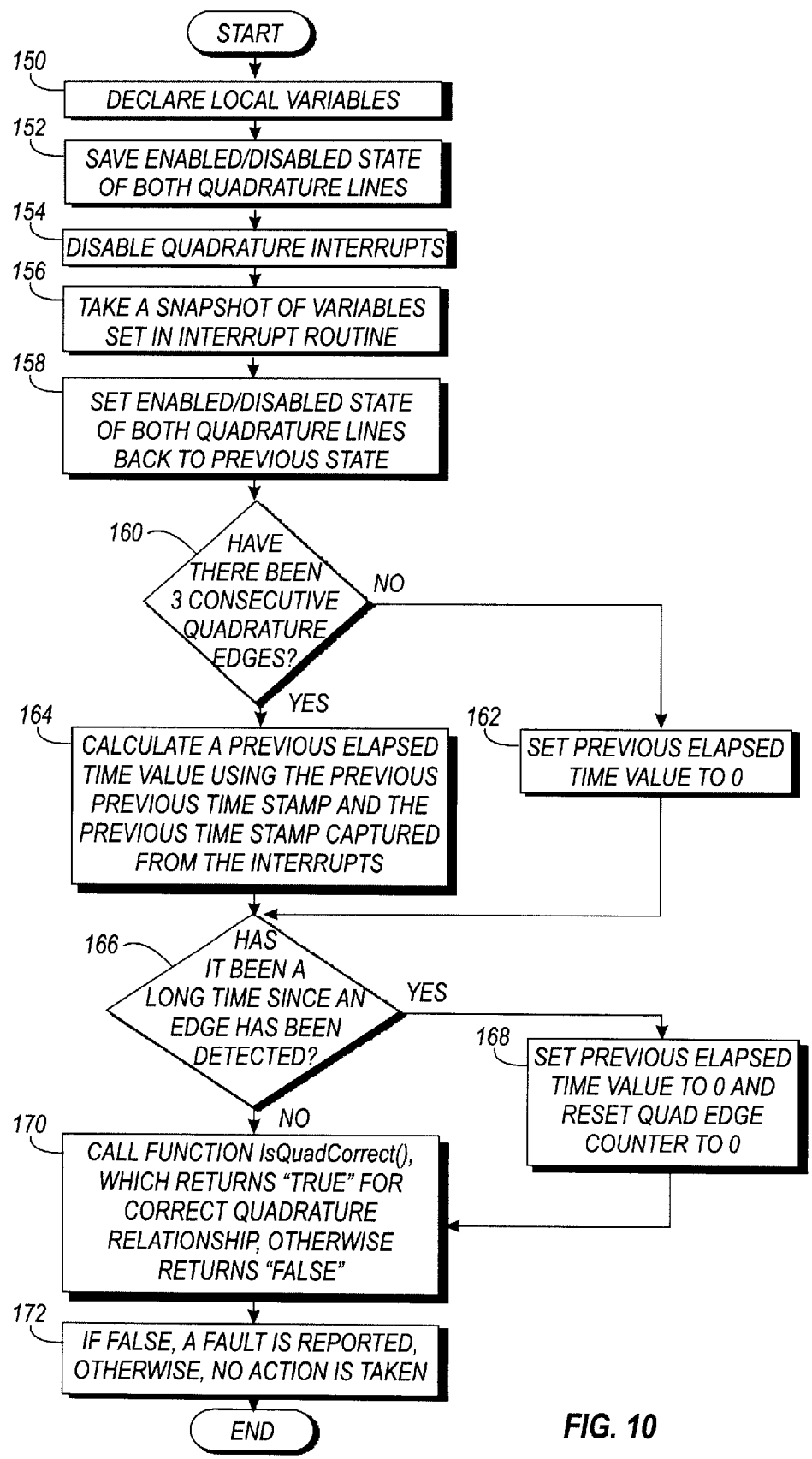
Figure 11:
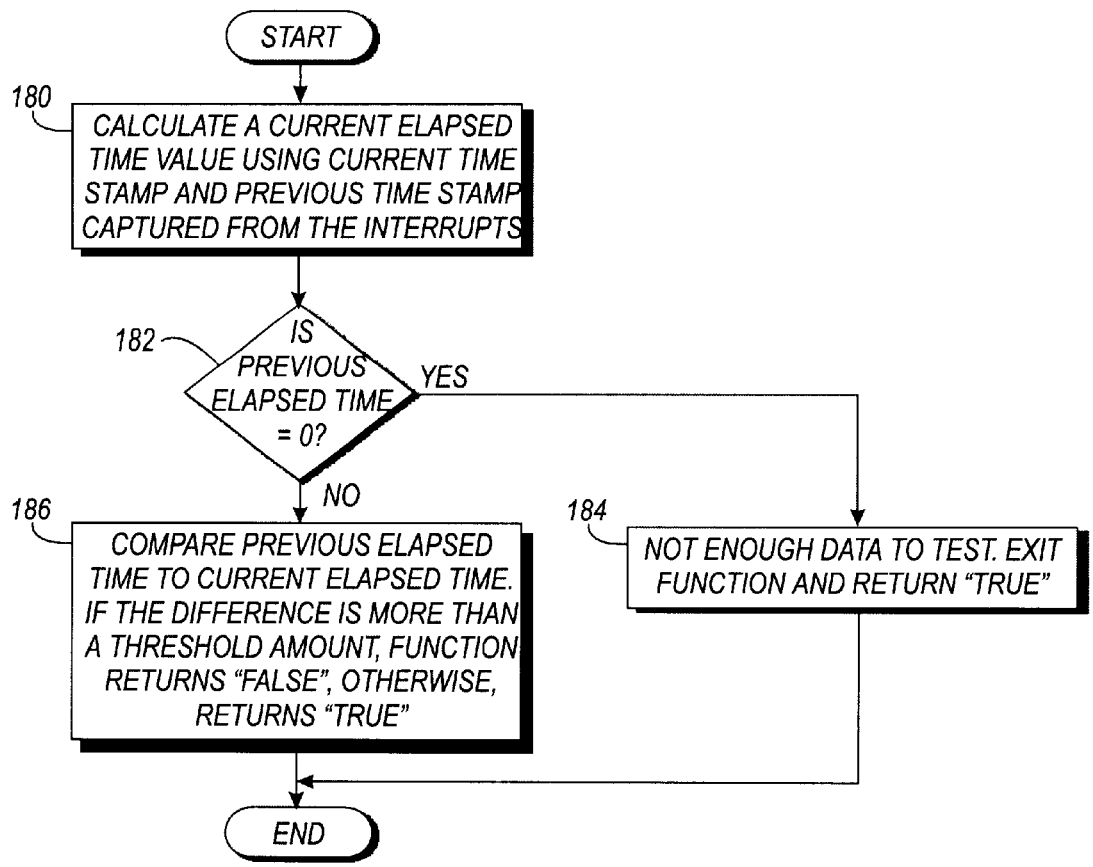

The present invention may be implemented in a number of ways. In one example, the quadrature signals are evaluated by software running in a microprocessor, such as the SCU 84 shown in FIG. 2. FIGS. 9–11 are flowcharts illustrating one example of how the present invention may be implemented using software. FIG. 9 illustrates a quadrature line's interrupt routine. The routine shown in FIG. 9 starts at step 130, where the other line's interrupt enabled/disabled status is saved. Next, at step 132, the other line's interrupt is disabled. At step 134, the quadrature edge counter is incremented. The edge counter keeps track of the number of edges since 3 edges are required for the main routine. At step 136, the process checks the last interrupt that occurred. If it was the same line that is currently interrupting, either the sensor is dithering or the microprocessor missed an interrupt. In either case, the process proceeds to step 138, where the edge counter is set to 1 and the process proceeds to step 140. If the last line that interrupted was not the same as the current line, the process proceeds to step 140. At step 140, the time stamps are saved (previous time stamp and previous previous time stamp) and a new time stamp is recorded. Next, at step 142, the other interrupt line is restored to the original enabled/disabled state.

FIG. 10 is a flowchart of the main fault detection algorithm. The process begins with step 150, where local variables are declared. The variables may include the quadrature edge counter, time stamps (current time, previous time, previous previous time), etc.. Next, at step 152, the enabled/disabled state of both quadrature lines are saved. At step 154, the quadrature interrupts are disabled. At step 156, a snapshot of the variables set in the interrupt routine is taken. Next, at step 158, the interrupts are restored to their previous states. At step 160, the process asks whether there have been 3 consecutive quadrature edges (e.g., A–B–A or B–A–B). If not, the process proceeds to step 162 and the previous elapsed time is set to 0. The process then proceeds to step 166. If there have been 3 consecutive quadrature edges, the process proceeds to step 164 where the previous elapsed time value is calculated using the previous time stamp and the previous previous time stamp. At step 166, the process asks whether it has been a long time since an edge has been detected. If so, the process proceeds to step 168 where the previous elapsed time value is set to 0 and the edge counter is reset. If not, the process proceeds to step 170 where the function IsQuadCorrect() (see FIG. 11) is called. The function returns "True" for a correct quadrature relationship, otherwise "False". At step 172, a fault is reported if "False" was returned, otherwise, no action is taken.

FIG. 11 is a flowchart of the function IsQuadCorrect( ), called in step 170, described above. The process begins with step 180, where the current elapsed time is calculated using the current time stamp and the previous time stamp values captured from the interrupts. Next, at step 182, the process asks if the previous elapsed time is equal to 0. If so, the process proceeds to step 184, where the function exits and returns the value "True" (because not enough data has been collected). If not, the process proceeds to step 186, where the previous elapsed time is compared to the current elapsed time. "False" is returned to the main algorithm if the difference is more than a threshold amount. Otherwise, "True" is returned.

As mentioned above, the present invention may be used for any desired application, in addition to steering systems. For example, any control system that relies on quadrature signals from quadrature encoders could utilize the present invention.

In the preceding detailed description, the invention is described with reference to specific exemplary embodiments thereof. Various modifications and changes may be made thereto without departing from the broader spirit and scope of the invention as set forth in the claims. The specification and drawings are, accordingly, to be regarded in an illustrative rather than a restrictive sense.

What is claimed is:

1. A method of validating a quadrature signal pair from a sensor in a steering control system comprising the steps of:
   detecting consecutive voltage transitions in first and second signals of the quadrature pair;
   for three consecutive detected voltage transitions, calculating the elapsed time between the first and second voltage transitions and the elapsed time between the second and third voltage transitions; and
   determining the validity of the quadrature signal pair by comparing the calculated elapsed times.

2. The method of claim 1, wherein the quadrature pair is considered valid if the elapsed times are similar in length.

3. The method of claim 1, wherein the quadrature pair is considered valid if the difference between the elapsed times is less than 50 percent of the lowest elapsed time.

4. The method of claim 1, wherein the quadrature pair is considered valid if the difference between the elapsed times is within a desired threshold.

5. A method of validating a quadrature signal pair in a steering control system comprising the steps of:
   detecting when a first signal of the quadrature pair changes states;
   detecting when a second signal of the quadrature pair changes states; and
   evaluating the validity of the quadrature signal pair based on when the first and second signals change states.

6. The method of claim 5, further comprising the steps of:
   calculating a first elapsed time value between a first state change in the first signal and a first state change in the second signal;
   calculating a second elapsed time value between the first state change in the second signal and a second state change in the first signal; and
   evaluating the validity of the quadrature pair by comparing the first and second elapsed time values.

7. The method of claim 6, wherein the quadrature pair is considered valid if the first and second elapsed time values are similar in length.

8. The method of claim 6, wherein the quadrature pair is considered valid if the difference between the first and second elapsed time values is less than 50 percent of the lowest elapsed time value.

9. The method of claim 6, wherein the quadrature pair is considered valid if the difference between the first and second elapsed time values is less than a threshold value.

10. A steering control system comprising:
    a quadrature sensor for sensing conditions in the system and generating a quadrature signal pair;
    a processor coupled to the quadrature sensor, wherein the processor performs the following functions:
        detecting edges in first and second signals of the quadrature pair,
        after detecting a plurality of consecutive edges, calculating elapsed time periods between consecutive edges, and
        determining the validity of the quadrature pair by comparing two adjacent elapsed time periods.

11. The steering control system of claim 10, wherein the quadrature pair is considered valid if the elapsed time periods are similar in length.

12. The steering control system of claim 10, wherein the quadrature pair is considered valid if the difference between the elapsed time periods is less than 50 percent of the lowest elapsed time period.

13. The steering control system of claim 10, wherein the quadrature pair is considered valid if the difference between the elapsed time periods is within a desired threshold.

14. The steering control system of claim 10, wherein the quadrature sensor senses the speed and direction of a moving object in the system.

15. The steering control system of claim 10, further comprising a plurality of quadrature sensors.

16. The steering control system of claim 10, wherein the functions performed by the processor are executed using software.

* * * * *